United States Patent [19]

Boutros

[11] 4,195,272

[45] Mar. 25, 1980

[54] FILTER CONNECTOR HAVING CONTACT STRAIN RELIEF MEANS AND AN IMPROVED GROUND PLATE STRUCTURE AND METHOD OF FABRICATING SAME

[75] Inventor: Kamal S. Boutros, Downsview, Canada

[73] Assignee: Bunker Ramo Corporation, Oak Brook, Ill.

[21] Appl. No.: 875,363

[22] Filed: Feb. 6, 1978

[51] Int. Cl.² ...................... H03H 7/04; H01R 19/10; H01R 13/66; H01R 17/16

[52] U.S. Cl. ...................................... 333/182; 29/828; 333/183; 333/185; 339/14 R; 339/147 R

[58] Field of Search ...................... 333/79, 70 S, 73 C, 333/76, 12, 181-185; 361/301-306; 29/629, 630 R, 630 A, 628, 625, 626, 627; 339/143 R, 147 R, 136 R, 14 R; 174/75 C, 68.5

[56] References Cited

U.S. PATENT DOCUMENTS

| | | | |
|---|---|---|---|
| 3,103,548 | 9/1963 | Councelman | 174/75 C X |
| 3,322,885 | 5/1967 | May et al. | 29/629 |
| 3,435,387 | 3/1969 | Reinke et al. | 333/79 |
| 3,721,869 | 3/1973 | Paoli | 333/79 |
| 3,743,979 | 7/1973 | Schor | 333/79 |
| 3,842,497 | 10/1974 | Kehl et al. | 29/629 X |
| 3,854,107 | 10/1974 | Tuchto et al. | 339/147 R X |
| 4,126,370 | 11/1978 | Nijman | 333/79 X |

OTHER PUBLICATIONS

Mutnick-"Repairing Breaks in Printed Circuits" in IBM Technical Disclosure Bulletin, vol. 8, No. 11, Apr. 1966; p. 1469.

*Primary Examiner*—Alfred E. Smith
*Assistant Examiner*—Marvin Nussbaum
*Attorney, Agent, or Firm*—F. M. Arbuckle; W. Lohff; T. Haller

[57] ABSTRACT

A multiple contact filter connector capable of accommodating high RF currents and a method of manufacturing the same are disclosed. The connector includes an outer metallic shell, a dielectric body within the shell and at least one network filter contact assembly. The inner body has at least one through channel and a transverse cavity which communicates with the shell and the channel. The network filter contact assembly has a ground electrode and a pin electrode and is disposed within the portion of the channel bridging the cavity. Conductive curable filler material is charged into the cavity around and in contact with the ground electrode to efficiently and inexpensively establish a ground plate for the connector. A retention means disposed within the channel and a locking means carried by the contact cooperate to provide axial strain relief, thereby protecting the bond between the conductive filler material and the ground electrode. Various embodiments of the inventive connector as well as numerous methods of manufacturing the same are illustrated and described.

31 Claims, 12 Drawing Figures

FILTER CONNECTOR HAVING CONTACT STRAIN RELIEF MEANS AND AN IMPROVED GROUND PLATE STRUCTURE AND METHOD OF FABRICATING SAME

BACKGROUND OF THE INVENTION

The present invention is directed generally to electrical connectors of a type providing protection from electromagnetic interference (EMI). More particularly, the invention is directed to a multiple contact filer connector capable of conducting high RF currents and a method of fabricating the same at greatly reduced manufacturing cost.

In numerous applications where long unshielded cable runs enter a shielded housing containing circuitry sensitive to extraneous signals picked up by the cable, it is necessary to provide electrical filter networks as an integral part of a connector to suppress transients and other undesired signals, such as EMI, which may otherwise exist on circuits interconnected by the connector. An illustrative prior art filter connector used in such applications is shown and described in Tuchto et al, U.S. Pat. No. 3,854,107, assigned to the same assignee as the present invention.

The filter connector illustrated in the aforementioned Tuchto et al patent includes a dielectric body supporting a plurality of filter contacts and a thin conductive foil ground plate. Each filter contact includes a filter network comprising multiple concentric filter elements coaxially mounted on a reduced diameter portion of the contact and an outer ground electrode. The filter contacts are dimensioned and configured to accommodate insertion and removal from the dielectric body with the ground electrodes contacting the thin foil ground plate through wiping action.

While multiple contact filter connectors of the foregoing variety have proven successful when used to conduct relatively low RF currents of approximately one-quarter ampere, they have not been suitable for conducting high RF currents of, for example, three or more amperes. Because the ground plates are thin, the heat generated by high current conduction cannot be adequately dissipated. As a result, the connectors overheat and, ultimately, fail.

In order to overcome this problem some prior art connectors employ a relatively wide metal ground plate. While such wide metal plates have sufficient mass and conductivity to dissipate the extreme heat generated by high RF current conduction, they are not flexible and, as a result, are not suitable for making low resistance wiping contact with the surface of the network filter ground electrodes. Hence, other means must be provided for establishing the required electrical connection between the ground plate and the network filter ground electrodes. In some prior art connectors the network ground electrode, and therefore the filter itself, is conductively bonded to the ground plate with a conductive adhesive, such as conductive epoxy. This approach, however, engenders other disadvantages. For example, each ground electrode must be individually bonded to the ground plate. Typically, a single connector may include as many as 120 network filters, and as a result, the manufacturing costs in fabricating such a connector in this manner is extremely high. In addition, after fabrication, should one of the network filters be found to be defective, in most cases, the entire connector must be discarded since replacement of the faulty network filter is usually not possible. Moreover, removal of the faulty network filter, if possible, would jeopardize the bond between the ground plate and the other network filters. One suggested solution to this problem is to test each individual network filter prior to its placement and bonding within the connector. But even this approach fails to provide a complete answer because there is always the possibility that one or more of these fragile filters might be damaged during network filter installation and bonding within the connector.

Another significant problem found in connectors having network filters bonded to the ground plate involves the transmission of forces to the contacts and filters during mating and unmating of the connector. These axial forces may be transmitted through the contact to the filter and, as a result, the bond between the network filter ground electrodes and the ground plate may be broken. When this occurs, even with respect to just one network filter, the entire connector usually must be discarded.

SUMMARY OF THE INVENTION

It is therefore a general aspect of the present invention to provide a new and improved high RF current filter connector which avoids the disadvantages and problems associated with prior art connector constructions.

It is another general aspect of the present invention to provide a new and improved method of fabricating a high RF current filter connector at greatly reduced manufacturing cost.

It is a further aspect of the present invention to provide a filter connector wherein the integrity of the bonds between the network filter ground electrodes and the connector ground plate is protected from axial forces applied to the connector contact members.

It is a still further aspect of the present invention to provide a filter connector wherein individual bonding of the network filter ground electrodes to the connector ground plate is avoided.

It is still another aspect of the present invention to provide a filter connector and method of fabricating the same wherein the network filters may be efficiently and systematically tested after being installed within the connector but before the network filters are securely bonded with the connector ground plate.

Accordingly, the invention is generally directed, in one of its broader aspects, to a filter connector including an electrically conductive outer shell, an inner body within the shell including a ground plate electrically coupled to the shell, at least one channel extending through the body and the ground plate, and a retention means disposed within the channel at a longitudinal position displaced from the ground plate. The connector further includes an extraneous signal filter means within at least a portion of the channel and including ground and pin electrodes with the ground electrode being electrically coupled to the ground plate. The connector further includes a contact member electrically coupled to the pin electrode and disposed at a fixed and predetermined axial position within the channel and a locking means carried by the contact member for engaging the retention means when the contact member is in the predetermined axial position to preclude axial movement of the contact member.

The invention is also directed to a filter connector comprising an electrically conductive shell, an inner body within the shell including at least one longitudinally extending channel and a transverse cavity communicating with the channel and the shell, and network filter means within at least a portion of the channel and extending through the cavity, the network including an external ground electrode within the cavity and a pin electrode. The connector also includes a contact member cooperating with the filter means with the contact member being electrically coupled to the pin electrode, and conductive filler material within the cavity, wherein the conductive filler material is electrically coupled to the shell and contacts the network ground electrode for establishing a ground plate within the inner body.

The invention still further provides a filter connector comprising an electrically conductive outer shell, an inner body within the shell including at least one longitudinally extending channel and a transverse cavity communicating with the channel and the shell, network filter means within at least a portion of the channel and extending through the cavity wherein the network means includes an external ground electrode within the cavity and a pin electrode, and a contact member cooperating with the filter means with the contact member being electrically coupled to the pin electrode. The connector also includes a thin metallic ground plate within the cavity which contacts the ground electrode, wherein the thin metallic ground plate provides an intermediate filter connector ground plate to facilitate the testing of the network filter means at low RF current levels, and conductive filler material within the cavity wherein the conductive filler material is electrically coupled to the shell and contacts the network ground electrode for establishing a final ground plate within the inner body for enabling high RF current conduction by the connector.

The invention is still further directed to a method of fabricating a ground plate within a filter connector of the type which includes an outer conductive shell having an inner surface, an inner body, and a filter network contact assembly within the body having a ground electrode. The method comprises the steps of providing a cavity within the shell around the ground electrode and thereafter flowing conductive filler material into the cavity around and in contact with the ground electrode and into electrical contact with the shell.

The present invention still further provides a method of manufacturing a filter connector of the type which includes an electrically conductive outer shell and an inner body assembly including an inner body having at least one channel extending through the inner body, a ground plate, and a network filter contact assembly within the channel having a ground electrode and a pin electrode. The method comprises the steps of providing a mold having an inner surface substantially corresponding in shape to the inner surface shape of the outer shell, inserting into the mold a first pre-formed dielectric member having at least one bore and an outer surface dimension corresponding to the inner surface shape of the mold, inserting into the first member bore the network filter contact assembly, inserting into the mold a second preformed dielectric member having at least one bore and an outer shell surface dimension corresponding to the inner surface shape of the mold and positioning the second member within the mold spaced apart from the first member forming a cavity therebetween and aligned with respect thereto so that the second member bore receives the network filter contact assembly and is aligned with the first member bore. The method additionally includes the steps of flowing curable conductive filler material into the cavity around and in contact with the network filter ground electrode, allowing the curable conductive filler material to cure to form an integral inner body assembly with the conductive filler material providing the connector ground plate, removing the integral inner body assembly from the mold, and thereafter inserting the integral inner body assembly into the outer conductive shell with the cured filler material electrically coupled to the shell.

BRIEF DESCRIPTION OF THE DRAWINGS

The features of the present invention, which are believed to be novel, are set forth with particularity in the appended claims. The invention, together with further objects and advantages thereof, may best be understood by reference to the following description taken in connection with the accompanying drawings, in the several figures of which like reference numerals identify like elements, and in which:

DESCRIPTION OF THE PREFERRED EMBODIMENTS

Figure 1:
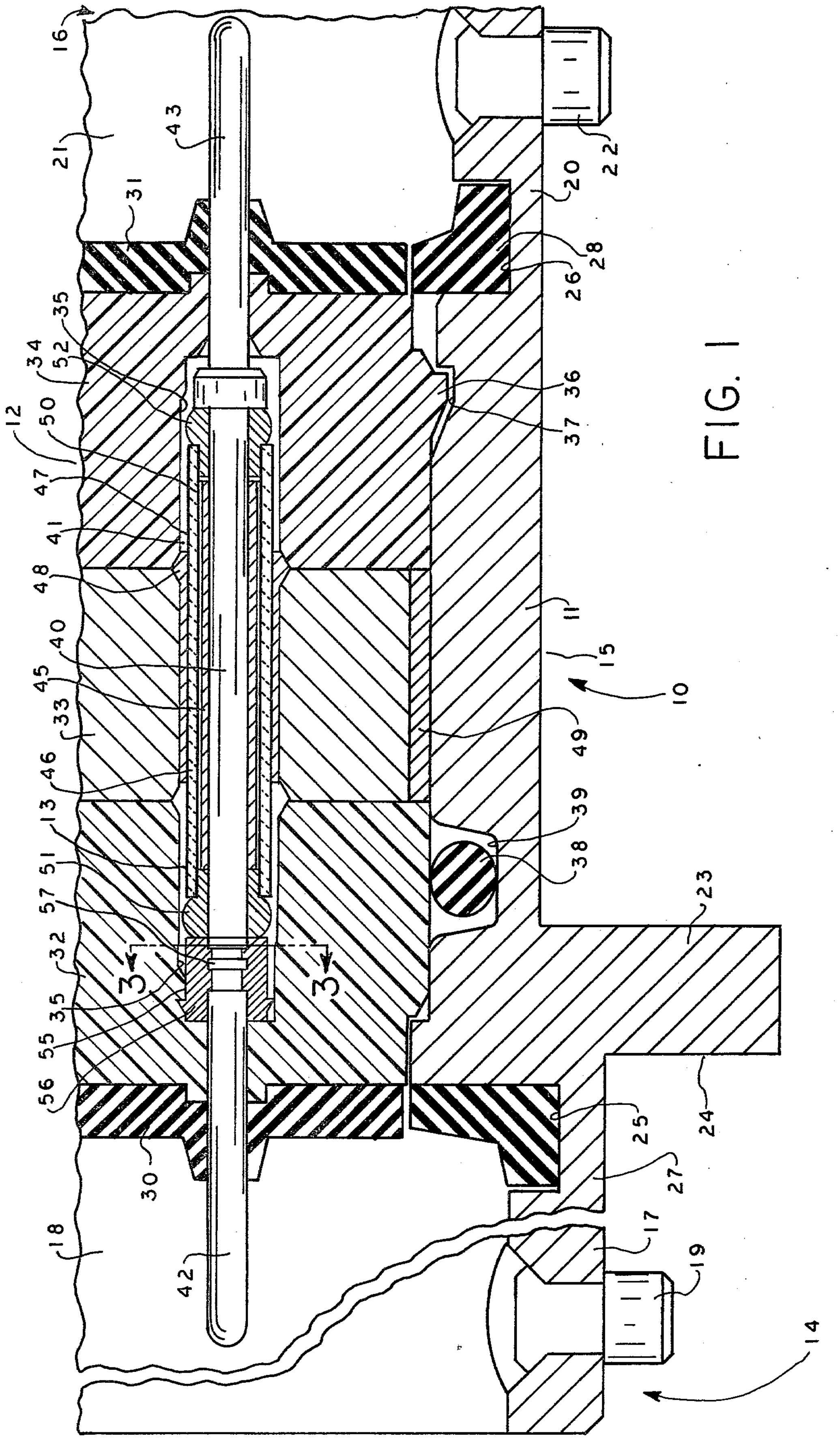
FIG. 1 is a partial, cross-sectional view, to an enlarged scale, illustrating a filter connector having a network filter strain relief means embodying one aspect of the present invention.

Referring now to FIG. 1, the connector 10 there illustrated is of the type generally referred to as an in-line filter connector. In general, it includes a conductive outer shell 11, an inner body portion 12, and a contact network filter assembly 13.

The conductive outer shell is preferably formed from metal, such as aluminum. It includes a forward end 14, a middle section 15, and a rear end 16. The forward end 14 includes an annular flange 17 defining a cavity 18 which is dimensioned to receive a mating connector dielectric insert. A pin 19 is carried on and radially extends from the flange 17 to provide a key. The key is dimensioned for being received by a recess within the mating connector outer shell for aligning the contacts of the mating connector with the contacts of the connector 10. The key 19, in those instances where the mating connector has a bayonet-type inclined recess within its outer ring, may also serve as a post to achieve bayonet mating of the two connectors.

The rear end 16 similarly includes an annular flange 20 defining a rear cavity 21 which is also dimensioned for receiving the dielectric insert of another mating connector. Also, the rear end flange 20 carries a pin 22. The pin 22 performs the same function as the pin 19 at forward end 14 to facilitate alignment and secure termination to a mating connector which may be of the bayonet variety.

The shell 11 further includes, intermediate the forward end 14 and middle section 11, a radially extending circumferential flange 23. Flange 23 has a forward surface 24. The forward surface 24 may be utilized for abutting the mating connector to limit its penetration into the cavity 18. The forward surface 24 may additionally be utilized for abutting the surface of a bulkhead should bulkhead mounting be desirable.

Both the forward flange 17 and rearward flange 20 include a circumferential slot 25 and 26 respectively. These slots are dimensioned for receiving correspondingly shaped annular sealing rings 27 and 28 respectively. The annular sealing rings 27 and 28 are preferably formed from resilient material, such as a fluorosilicon rubber. The seals 27 and 28 provide annular sealing between the connector 10 and the connectors to be mated thereto at each end.

The inner body portion 12 is contained within the middle section 15 of shell 11. The inner body portion includes a plurality of laminant inserts which are arranged side-by-side to form the inner body. The laminant inserts comprise a forward face seal 30, a rear face seal 31, a first dielectric insert 32, a metallic conductive ground plate insert 33, and a second dielectric insert 34. Each of the inserts includes a through bore. The bores are aligned to form a channel 35 extending through the inner body 12. Although one channel is illustrated in FIG. 1, it is, of course, to be understood that a filter connector of the type illustrated may have a plurality of such channels. The bores within the inserts are individually dimensioned so that the resulting through channel 35 is dimensioned generally corresponding to the outer dimension of the contact network filter assembly 13.

The ground plate 33 is of substantial width dimension to enable high RF current conduction. It is electrically coupled to the conductive shell 11 by conductive epoxy 49.

The inner body portion 12 is locked within the shell by a peripheral protrusion 36 carried on the outer periphery of the second dielectric insert being received within a correspondingly dimensioned circumferential slot 37 within the shell. Additionally, a resilient O-ring 38 seated within an annular recess 39 of the shell and between the shell and the first dielectric insert 32 absorbs dimensional tolerances between the inner body and the inner surface of the shell 11 and to provide a seal therebetween.

The contact network filter assembly extends through the channel 35 and includes a contact member 40, and a network filter 41. The contact member 40 includes a forward end portion 42 which extends into the forward cavity 18 by a predetermined extent when the contact network filter assembly is within the channel 35 at a predetermined axial position. Similarly, contact member 40 includes a rear contact portion 43 extending into the rear cavity 21. Contact portions 42 and 43 are both of the pin variety which is characteristic of one type of in-line connector.

The network filter 41 is carried by the contact member 40 at an axial position intermediate its ends. The network filter 41 includes a ferrite tubular member 45 disposed about contact member 40 and a ceramic tubular member 46 coaxially disposed about the contact member 40 and the ferrite member 45. The ceramic member 46 is plated on its external surface with conductive material to form the ground electrode 47 of the network filter. The ground electrode 47 is electrically connected to the ground plate 33 by conductive epoxy 48 or solder.

The ceramic member 46 also includes conductive plating on its inner surface forming the pin electrode 50 of the network filter. A forward conductive elastomeric sleeve 51 and a rear conductive elastomeric sleeve 52 is carried by contact member 40 and is partially disposed between the ceramic member 46 and the contact member 40 to electrically couple the pin electrode 50 to the contact member 40. As a result, an equivalent pi network filter is formed which is secured to the contact member 40.

To protect the bond between the ground electrode 47 and the ground plate 33 provided by the conductive epoxy 48, and in accordance with the present invention, the connector 10 includes a network filter strain relief means which axially fixes the contact network filter assembly 13 relative to the inner body 12. It comprises a retention means 55 disposed within the channel 35 and a locking means 56 which is carried by the contact member 40.

Figure 2:
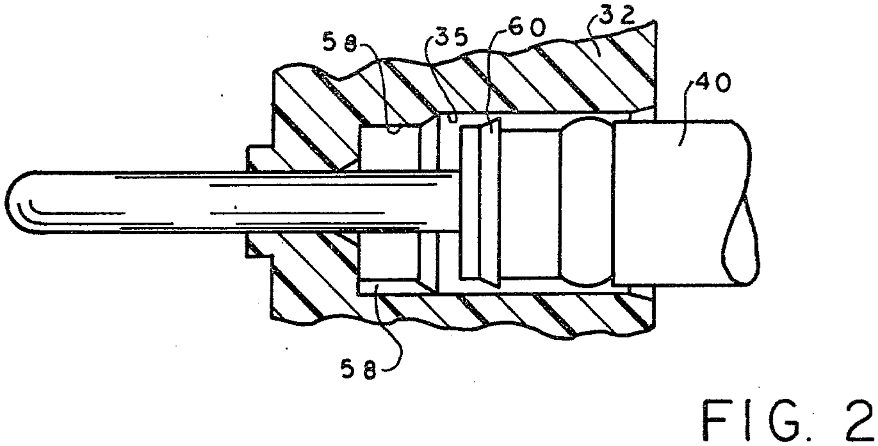
FIG. 2 is a partial, cross-sectional view, to an enlarged scale, illustrating a contact member and connector inner body through channel prior to the contact member being locked within the channel.
Figure 3:
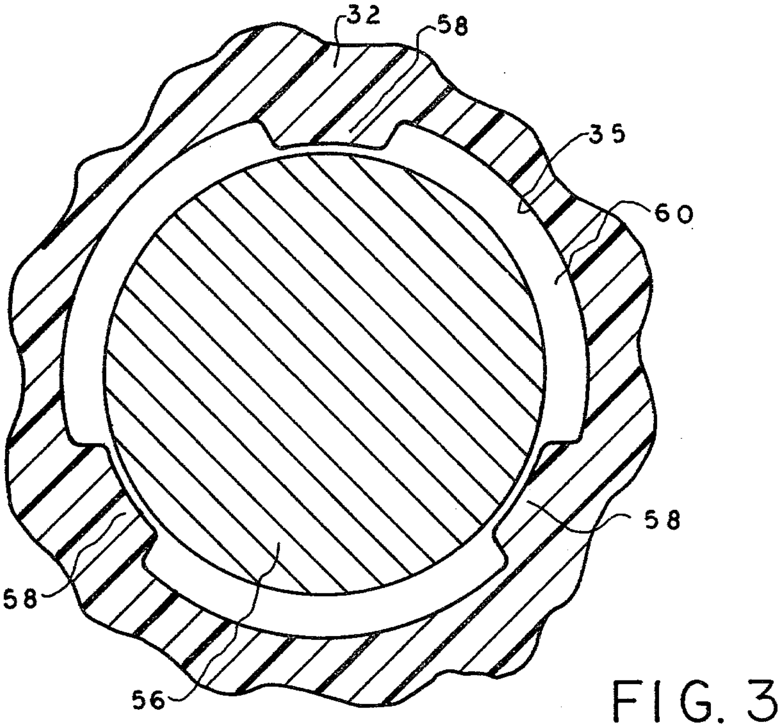
FIG. 3 is a partial, cross-sectional view, to an enlarged scale, taken along lines 3—3 of FIG. 1.
Figure 4:
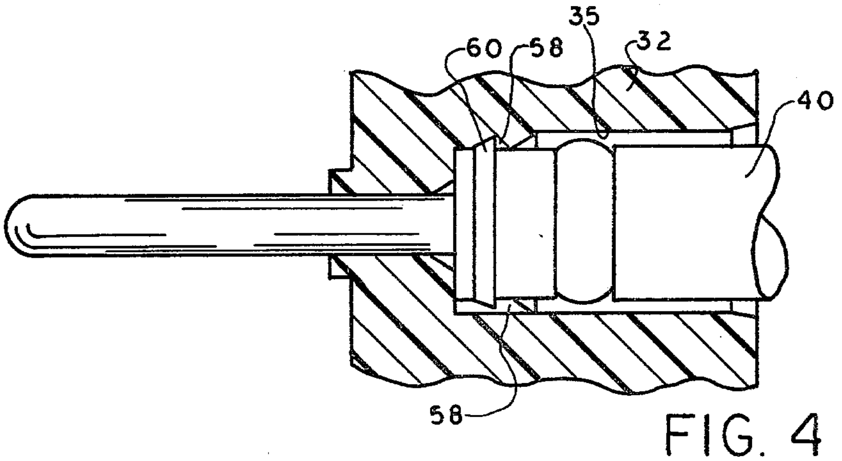
FIG. 4 is a partial, cross-sectional view, to an enlarged scale, similar to FIG. 2 illustrating the contact member locked within the channel.

As best seen in FIGS. 2 through 4, the retention means 55 of the channel 35 includes a plurality of ribs 58. The ribs 58 are equally radially spaced about the channel 35 and extend radially inwardly into the channel. The locking means 56 carried by the contact member 40 is preferably in the form of a metallic sleeve which is fixed in an axial position on the contact member 40 by a radial flange 57 of the contact member. The sleeve includes one or more protrusions extending radially outwardly from the contact member, for example, one or more wedge-shaped circumferential flanges 60. The first dielectric insert member 32 is preferably formed from a plastic material which is resilient to a limited extent. As shown in FIG. 2, the contact network filter assembly is within the channel 35 prior to being locked within the channel at the predetermined axial position. FIG. 4 illustrates the contact member 40 locked within the channel 35. When the contact member 40 is at the predetermined axial position within channel 35, the wedge-shaped circumferential flange or flanges 60 are imbedded within the ribs 58. As a result, the contact member 40 is securely locked within the connector channel 35.

Because the contact network filter assembly is securely locked within the channel 35, any axial stress applied to the contact member will not be transferred to the network filter. Hence, the bond between the ground electrode 47 and ground plate 33 is protected.

The integrity of the bond is further protected by the provision of the conductive elastomeric sleeves 51 and 52. The sleeves 51 and 52 provide further strain relief between the contact member 40 and the network filter 41.

Figure 5:
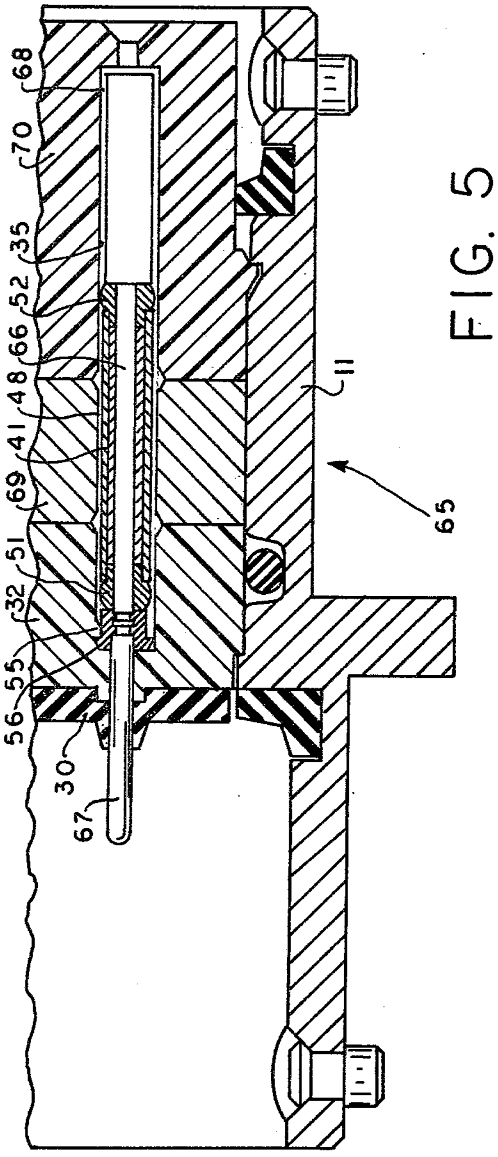
FIG. 5 is a partial, cross-sectional view, to an enlarged scale, of another filter connector having a network filter strain relief means embodying the present invention.

The connector 65 of FIG. 5 is another variety of in-line connector which incorporates the network filter strain relief means of the present invention. This in-line connector includes a contact member 66 having a forward pin contact portion 67 and a rear socket contact portion 68. The network filter 41 and shell 11 of connector 65 are substantially identical to the network filter and shell of the connector 10 illustrated in FIG. 1 which have already been described in detail. Therefore, the shell and network filter of the connector of FIG. 5 will not be described in detail herein.

The inner body of connector 65 includes the forward face seal insert 30, the first dielectric member 32, a metallic ground plate 69, and an elongated second dielectric insert 70. Again, each of the inserts includes a bore which is aligned to form the channel 35 through the inner body. The socket contact 68 is adapted for receiving a pin contact of a mating connector.

The ground electrode of the network filter 41 is bonded to the ground plate 69 by the conductive epoxy 48. To provide strain relief and to protect the integrity of the bond between the ground electrode of the filter 41 and the ground plate 69, the connector 65 includes the retention means 55 and the locking means 56 in the same manner as described with respect to the connector of FIG. 1. Also, in accordance with the invention, the connector 65 includes the conductive elastomeric sleeves 51 and 52 for electrically connecting the pin electrode of the network filter to the contact member 48 and to provide additional strain relief between the contact member and the network filter 41 in the same manner as described with respect to the connector 10 of FIG. 1.

Figure 6:
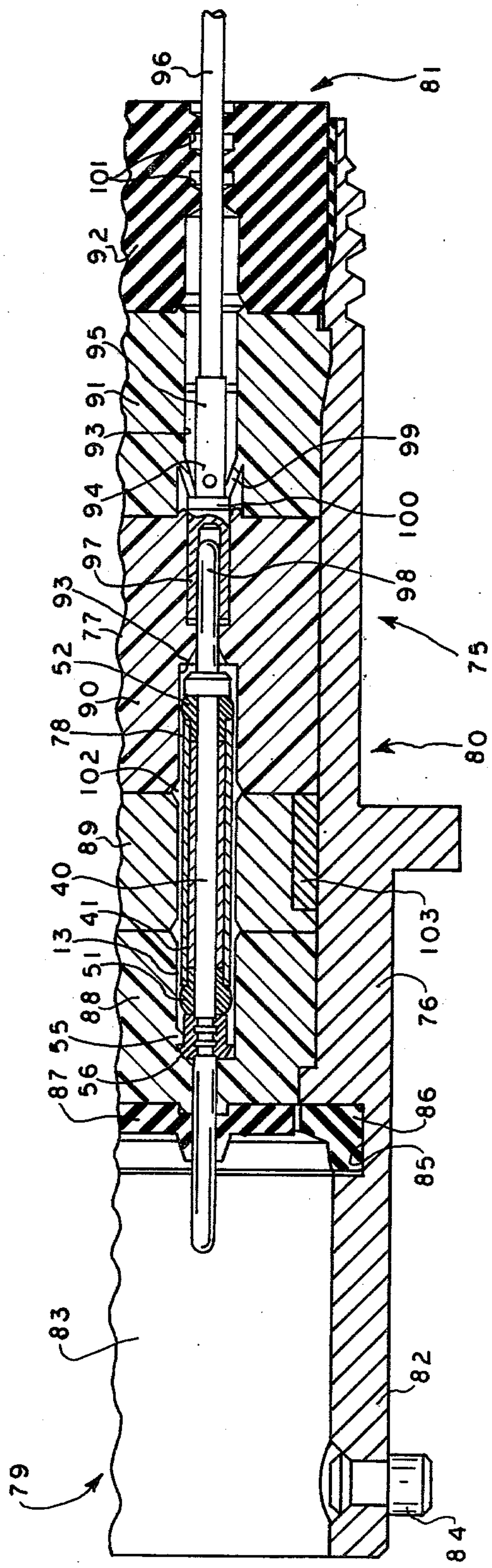
FIG. 6 is a partial, cross-sectional view, to an enlarged scale, illustrating still another filter connector having a network strain relief means embodying the present invention.

Referring now to FIG. 6, it illustrates a terminating type connector which also incorporates the network filter strain relief means in accordance with the present invention. The connector 75 there illustrated generally includes an outer conductive shell 76, an inner body 77, and a contact network filter assembly 78.

The outer conductive shell 76 is preferably formed from metal, such as aluminum. Like the connectors of FIGS. 1 and 5, it includes a forward end 79, a middle section 80 and a rear end 81.

The forward end 79 of connector 75 is substantially identical to the forward end 14 of the connector 10 illustrated in FIG. 1 which has been described in detail. Suffice it to say here that the forward end 79 includes an annular flange 82 which defines a forward cavity 83 which is dimmensioned for receiving a mating connector. Also, the forward end includes a pin 84 carried on the flange 82 and an annular groove 85 which contains a correspondingly dimensioned annular sealing ring 86.

The inner body 77 includes a forward face seal 87, a first dielectric insert 88, a ground plate 89, and a second dielectric insert 90. The inner body also includes a pair of end inserts 91 and 92. Each of the inserts includes a through bore which are aligned to form a channel 93 extending through the inner body. The various bores are so dimensioned that the resulting channel is dimensioned generally corresponding to the dimension of the contact network filter assembly 78 and a terminal 94 connected thereto. The terminal 94 has a crimp end 95 which is crimped to the conductor of wire 96. The terminal 94 also has a forward end constituting a socket 97 which receives the rear contact 98 of the contact filter network assembly. A pair of tines 99 which extend into the bore of the rear insert 91 communicate with a flange 100 of terminal 94 to securely hold the terminal 94 within the channel.

The most rearward insert 92 is preferably formed from a rubber-like material such as fluorosilicon. Its bore has a corrugated inner surface portion 101 which contacts the insulation of wire 96. The corrugated inner surface therefore provides a rear seal between the wire 96 and the channel 93.

The network filter 78 is identical to the network filter 41 of the connector illustrated in FIG. 1 and therefore need not be described in detail herein. Like the network filter 41, it also includes a ground electrode which is electrically coupled to the ground plate 89 by conductive epoxy 102. The ground plate 89 is in turn electrically coupled to the outer conductive shell 76 by conductive epoxy 103.

To protect the bond between the ground electrode of the network filter 78 and the ground plate 89, the connector 75 includes the network filter strain relief means including the retention means 55 within channel 93 and the locking means 56. Also, to provide further strain relief and electrical connection between the network filter pin electrode and contact member, the connector 75 also includes the conductive elastomeric sleeves 51 and 52.

As can be seen from the foregoing connector filter embodiments of FIGS. 1, 5 and 6, the strain relief means of the present invention may be incorporated into virtually any type of filter connector where axial stress isolation between the contact network filter assembly and the connector inner body is required to protect the bond between the ground electrode of the filter and the ground plate. Furthermore, the strain relief means of the present invention may be incorporated into many different types of connectors including in-line and terminating connectors.

Figure 7:
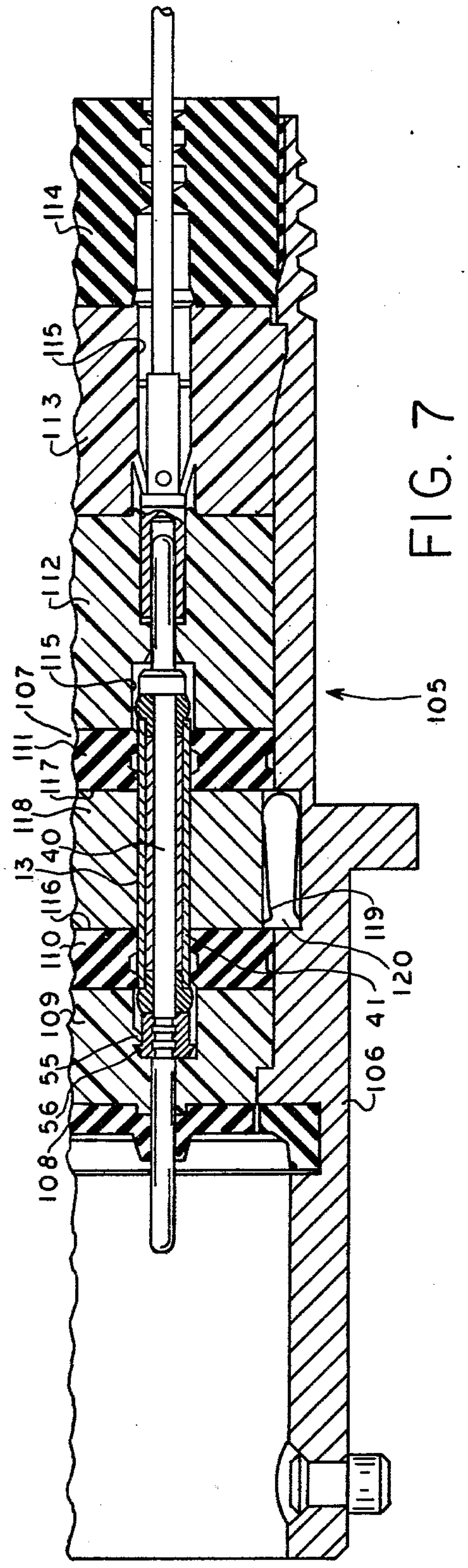
FIG. 7 is a partial, cross-sectional view, to an enlarged scale, illustrating a filter connector having a ground plate formed from conductive filler material in accordance with a further aspect of the present invention.

In accordance with another aspect of the present invention, reference is now made to FIG. 7. FIG. 7 illustrates a a filter connector 105 which generally includes an outer conductive shell 106, an inner body 107, and the contact network filter assembly 13.

The inner body 107 comprises a plurality of insert members which include a face seal 108, a first dielectric insert 109, a first resilient insert 110, a second resilient insert 111, a second dielectric insert 112, and a pair of end inserts 113 and 114. Each of the inserts includes a through bore which are aligned to define a channel 115 extending trhough the inner body 107. The first and second resilient inserts 110 and 111 are spaced apart with their facing sidewalls -16 and 117 defining a transverse cavity within the shell 106.

The contact network filter assembly 13 includes the contact member 40 and the network filter 41. The network filter 41 is positioned within the channel 115 and bridges across the cavity defined by the sidewalls 116 and 117. The cavity is filled with a curable conductive filler material forming the ground plate 118 of the connector. The conductive filler material 118 is electrically coupled to the shell 106 by a spring member 119 which is confined within an annular recess 120 of the shell 106. The conductive filler material also surrounds and contacts the network filter 41.

A suitable material which may be utilized to constitute the conductive filler material may be curable conductive epoxy such as silver loaded epoxy. The use of the conductive filler material for establishing the ground plate of the filter connector is advantageous because the conductive filler material may be introduced into the cavity around the network filters so that each of the network filters is coupled to the ground plate during the same fabricating step. Hence, individual bonding by hand of each of the filter networks to the ground plate is avoided. Additionally, the sidewalls 116 and 117 of the cavity may be sufficiently spaced apart so as to provide a ground plate of substantial width dimension to enable the connector to accommodate high RF currents. To protect the integrity of the bond between the filter network and the conductive filler material, the connector 105 also includes the strain relief means comprising the retention means 55 within the channel and the locking means 56 carried by the contact member 40.

Figure 8:
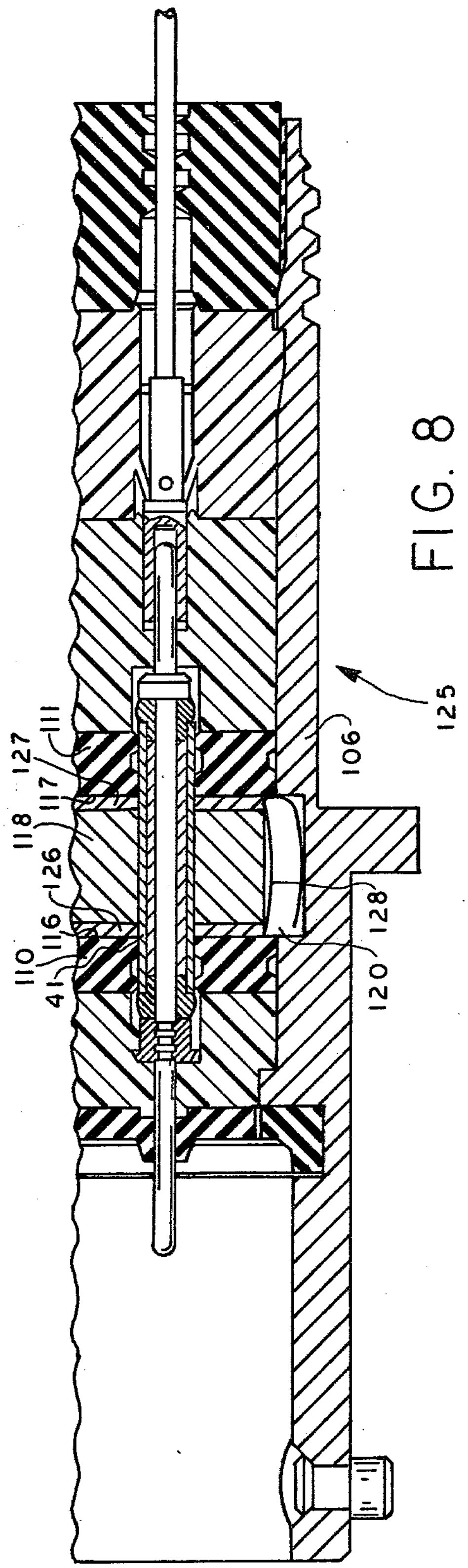
FIG. 8 is a partial, cross-sectional view, to an enlarged scale, showing another filter connector embodying a further aspect of the invention.

Referring now to FIG. 8, the filter connector 125 there shown is substantially identical to the filter connector 105 of FIG. 7 except that the facing wall surfaces 116 or 117 of the first and second resilient inserts 110 and 111 respectively contain conductive plate 126 or 127. The conductive plates 126 and 127 are in contact with the conductive filler material 118 in broad surface contact. Additionally, the plates 126 and 127 are in contact with a spring member 128. Spring member 128 is within the annular recess 120 and is shaped to contact the conductive shell 106 and the plates 126 and 127.

The plates 126 and 127 are also in contact with the network filter 41. This further embodiment of the present invention therefore provides, by virtue of the plates 126 and 127 and the conductive filler material 118, an efficient ground plate structure for the filter connector which also renders the filter connector capable of conducting high RF currents.

Figure 9:
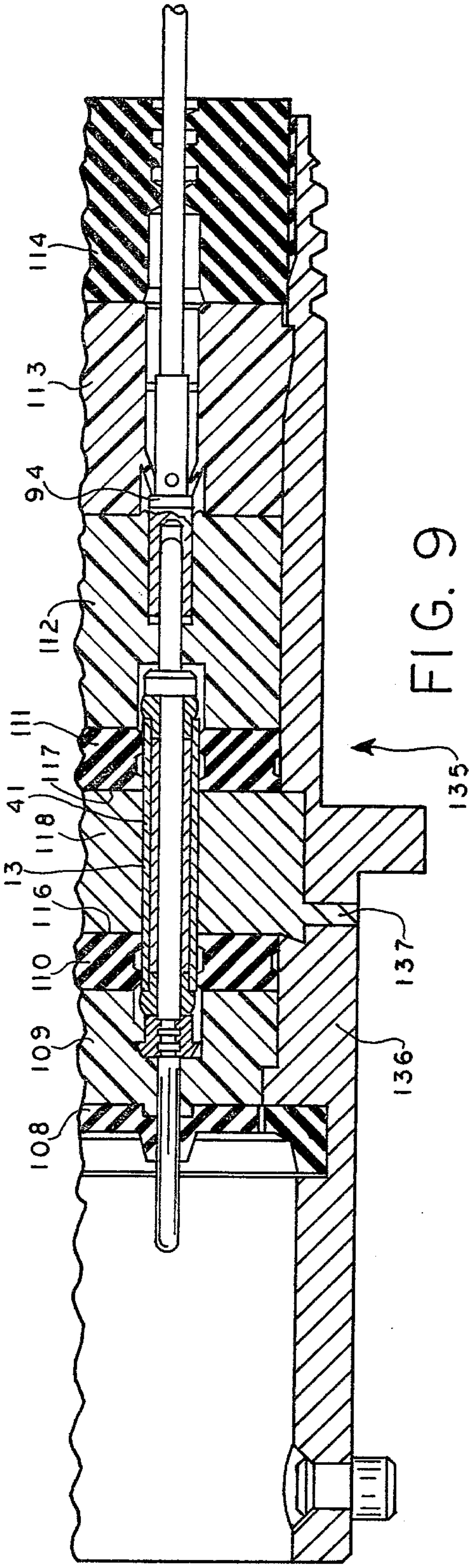
FIG. 9 is a partial, cross-sectional view, to an enlarged scale, of another filter connector constructed in accordance with the present invention.

The filter connector 135 of FIG. 9 illustrates a further embodiment of the present invention. In this embodiment, the connector 135 also utilizes the conductive filler material 118 for establishing the ground plate of the filter connector. However, the intimate contact between the conductive filler material and the outer conductive shell 136 is relied upon for establishing the electrical connection between the ground plate and the outer conductive shell. The cavity containing the conductive filler material 118 is also defined by the sidewalls 116 and 117 of the first and second resilient insert members 110 and 111. The cavity also communicates with the outer conductive shell to allow the conductive filler material 118 to be in close intimate contact therewith.

The shell 136 also includes a plurality of apertutes which extend from the cavity to the exterior of the shell. One such aperture is shown at 137.

In fabricating the filter connector 135 of FIG. 9 in accordance with the present invention, the insert members 108, 109, 110 and 111 are first loaded into the conductive shell 136 with the members 110 and 111 being spaced apart so that their facing sidewalls 116 and 117 define the cavity which ultimately receives the conductive filler material. The contact network filter assemblies such as the contact network filter assembly 13 are then loaded into the connector by being inserted into the channel defined by the loaded insert members such that their network filters 41 bridge across the transverse cavity. The remaining insert members comprising insert members 112 through 114 may then be loaded into the conductive shell. At this time, the conductive filler material, such as conductive curable epoxy, is injected into the apertures 137 to fill the cavity with the conductive filler material. The conductive filler material may be injected into each aperture, one at a time, until residual filler material begins to flow from the apertures. When this occurs, it is known that the cavity is completely filled with the conductive filler material. The conductive filler material is then allowed to cure. After the conductive filler material is fully cured, the fabrication of the connector is completed.

Figure 10:
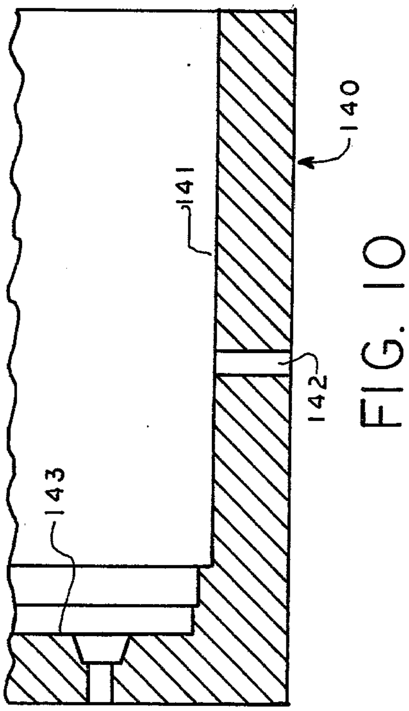
FIG. 10 is a partial, cross-sectional view, to an enlarged scale, illustrating a mold which may be used in fabricating the filter connectors of FIGS. 7 and 8 in accordance with another aspect of the present invention.

The filter connectors illustrated in FIGS. 7 and 8 may be fabricated in accordance with another aspect of the present invention by making use of the mold shown in FIG. 10. The mold 140 has a generally cylindrical outer dimension. The mold also has an inner surface 141 which generally corresponds in shape to the shape of the inner surface of the outer conductive shells 106. The mold 140 has a lesser length dimension than the shells and is so dimensioned to accommodate the insert members 108, 109, 111 and 112 and the conductive filler material 118. The mold 140 does not include an annular recess corresponding to the recess 120 of the connectors 105 and 125 so that the annular space of the recess will be unoccupied to allow the spring members 119 and 128 to be inserted therein.

The mold 140 also includes a plurality of apertures which extend from the interior of the mold to the exterior of the mold. One such aperture is shown at 142.

In fabricating the connectors of FIGS. 7 and 8, the face seal 108 which is preformed, is inserted into the mold and pressed against the forward face 143 of the mold. Thereafter, members 109 and 110 are inserted into the mold in closely packed relation. Thereafter, the contact network assemblies, such as assembly 13, are inserted into the channels formed by the insert members 108 through 110. Thereafter, the insert members 111 and 112 are placed into the mold and aligned with the other members so that they receive in their through bores the contact network filter assemblies. The insert members 110 and 111 are spaced apart to define the cavity which will receive the conductive filler material 118. The apertured 142 are located at such a point that they will communicate with the cavity thus formed.

The conductive filler material is then injected into the cavity through the apertures 142. The conductive filler material is injected into each aperture 142, one at a time, until residual filler material flows from the apertures. As the conductive filler material is injected and flowed into the cavity, it will be caused to surround and make intimate surface contact with the ground electrodes of the filter networks which bridge the cavity. After the conductive filler material has fully cured, the inserted insert members and the ground plate formed by the conductive filler material are removed as an integral inner body assembly. The spring member 119 is then placed within the annular recess 120. The inner integral body assembly is then inserted into the shell so that the spring member 119 contacts the cured conductive filler material. The last step in the fabrication process is the insertion of the last two insert members 113 and 114 into the conductive shell.

Figure 11:
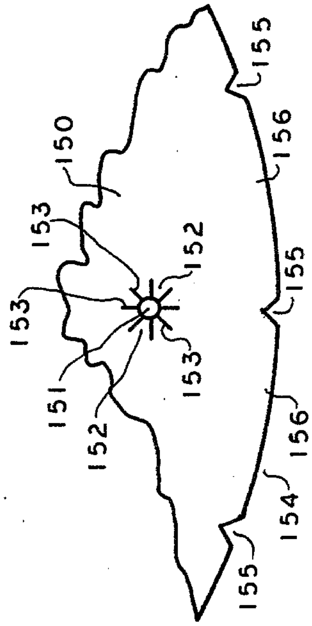
FIG. 11 is a partial plan view, to an enlarged scale, of an intermediate ground plate which may be used in accordance with another aspect of the present invention for pre-testing connector network filters prior to final fabrication.
Figure 12:
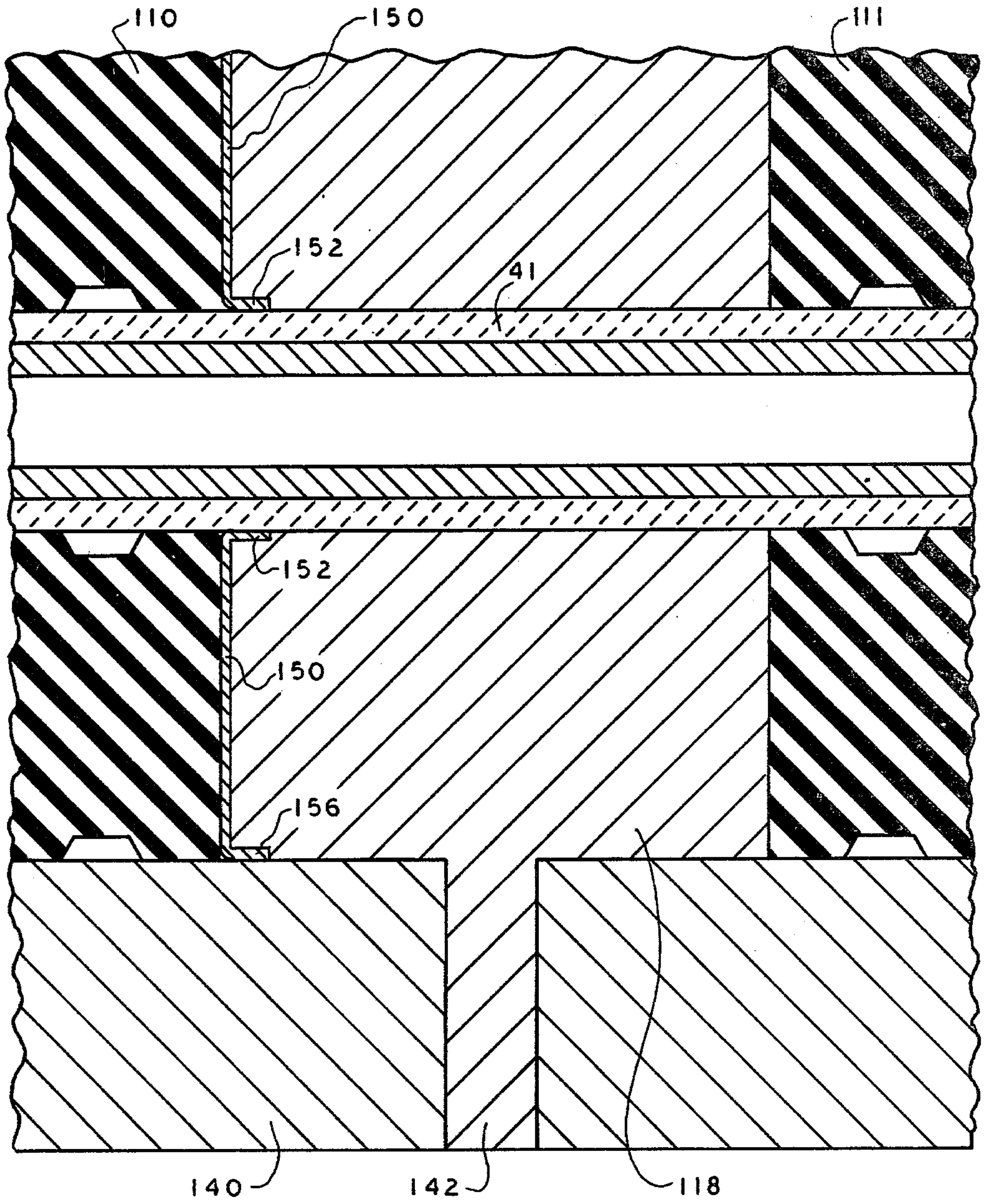
FIG. 12 is a partial, cross-sectional view, to an enlarged scale, illustrating a filter connector within the mold of FIG. 10 during fabrication and having the intermediate ground plate of FIG. 11.

Referring now to FIG. 11, it shows an intermediate ground plate 150 which may be utilized during the fabrication of the connectors of FIGS. 7 through 9 for pre-testing the network filters before the conductive filler material is injected into the cavity and around the network filters. The intermediate ground plate is constructed from relatively thin metallic foil material. It includes a plurality of apertures one of which is shown at 151. The apertures include a plurality of tines 152 extending towards the center of the aperture. The tines are formed by radial cuts 153 in the foil so that the tines will individually flex. The inner aperture defined by the tines is dimensioned to be smaller in dimension than the other dimension of the network filters. The outer periphery 154 of the intermediate ground plate is dimensioned to be slightly larger than the inner diameter dimension of the mold 140 of FIG. 10 and the inner diameter dimension of the conductive outer shells. The outer periphery 154 also includes a plurality of inwardly extending cut-outs 155 so that the outer edge 156 of the intermediate ground plate will also be adapted for flexure. In fabricating one of the filter connectors, such as filter connector 105 illustrated in FIG. 7, after the insert member 110 is inserted into the mold and the filter networks are threaded through the channels into their final axial position, the intermediate ground plate is inserted into the mold with the apertures 151 being received by the network filters. As the intermediate ground plate is inserted into the mold, the tines 152 will flex in a rearward direction and make wiping contact with the ground electrodes of the network filters. FIG. 12 illustrates the intermediate ground electrode in this orientation. In FIG. 12 it can be seen that the intermediate ground electrode 150 is adjacent the insert member 110. The tines 152 have been flexed rearwardly and make wiping contact with the network filter 41. Also, the peripheral edge portions 156 of the ground plate make wiping contact with the metallic mold 140.

After the intermediate ground plate 150 is inserted into the mold in the position illustrated in FIG. 12, the other insert members are also inserted into the mold. Because the intermediate ground plate is in contact with the ground electrode of the networks and in contact with the mold, the individual contact network filter assemblies may be pre-tested at low RF currents for the purpose of determining if any of the network filters are faulty. If a faulty network filter is located, it is a simple matter to replace the faulty network filter within the mold.

After all of the network filters have been tested, and the faulty network filters replaced with properly functioning filters, the conductive filler material 118 may be injected into the apertures 142 of the mold to establish the ground plate of the filter connector. It of course can be appreciated that the intermediate ground plate 150 may also be utilized for fabricating the filter connector illustrated in FIG. 9 in the same manner. After the conductive filler material has totally cured, a ground plate of substantial width dimension is provided which adapts the filter connectors for high RF current conduction.

From the foregoing, it can be seen that the method of fabricating a filter connector in accordance with the present invention obviates many of the shortcomings of the prior art methods. Because the ground plates are formed from conductive filler material which is injected into a cavity of the inner body of the connector to make contact with the ground electrodes of all of the network filters during the same fabrication process step, the tedious individual hand bonding of each of the network filters to the ground plates is avoided. Furthermore, by utilizing the intermediate ground plate, the network filters may be systematically pre-tested to locate faulty network filters. The pre-testing need not be performed by hand, and in fact, it is preferable to mate the connectors in fabrication with a corresponding mating connector which is coupled to automated test apparatus. Should a network found to be faulty, because it is not bonded to the ground plate of the connector, replacement of the faulty connector is a simple matter. Hence, after a connector is fabricated in accordance with this aspect of the present invention, each network filter will be known to be a properly functioning network filter. The scrapping of a connector, due to even one network filter being faulty, is therefore avoided.

While particular embodiments of the present invention have been shown and described, modifications can be made, and it is intended in the appended claims to cover all such changes and modifications which fall within the true spirit and scope of the invention.

I claim:

1. A filter connector comprising:

an electrically conductive outer shell;

an inner body within said shell including a ground plate electrically coupled to said shell, a longitudinally extending channel, and retention means disposed within said channel; and a filtered contact assembly disposed at least partially within said chamber including a contact member, filter means electrically coupled to and mounted in a fixed axial position on said contact member, said filter means also including a ground electrode electrically coupled to said ground plate with conductive adhesive material, locking means, carried by said contact member for engaging said retention member to maintain said filtered contact assembly in a fixed axial position relative to said inner body, and a resilient sleeve disposed between said locking means and said filter means for providing axial stress isolation between said filter means and said contact member.

2. A filter connector as defined in claim 1 wherein said retention means includes at least one rib extending radially inwardly into said channel and wherein said locking means includes a protrusion extending radially outwardly from said contact member to frictionally engage said rib when said contact member is in said fixed axial position.

3. A filter connector as defined in claim 2 wherein said retention means comprises a plurality of said ribs spaced circumferentially within said channel.

4. A filter connector as defined in claim 2 wherein said locking means protrusion comprises a wedge-shaped circumferential flange adapted to be embedded within said one rib when said contact member is in said fixed axial position.

5. A filter connector as defined in claim 4 wherein said locking means further comprises a metallic sleeve which is crimped onto said contact member.

6. A filter connector as defined in claim 1 wherein said conductive adhesive material comprises conductive epoxy.

7. A filter connector comprising:

an electrically conductive outer shell;

an inner body within said shell including a ground plate electrically coupled to said shell and at least one channel extending through said body and said ground plate, said channel having a plurality of circumferentially spaced inwardly extending ribs;

filter means within said channel including a pin electrode and a ground electrode, said ground electrode being electrically coupled and mechanically affixed with conductive adhesive to said ground plate;

a contact member electrically coupled to said pin electrode and extending axially from said channel at a predetermined axial position relative to said body; and a rigid sleeve fixed to said contact member, said rigid sleeve including a wedge-shaped circumferential flange means engaging said channel ribs to preclude axial movement of said contact member relative to said inner body.

8. A filter connector as defined in claim 7 further comprising a resilient sleeve carried by said contact member between said rigid sleeve and said filter means for providing axial stress isolation between said filter means and said contact member.

9. A filter connector comprising:

an electrically conductive outer shell;

an inner body within said shell including at least one longitudinally extending channel and a transverse cavity communicating with said channel and said shell;

network filter means within at least a portion of said channel and extending through said cavity, said network including an external ground electrode within said cavity and a pin electrode;

a contact member cooperating with said filter means, said contact member being electrically coupled to said pin electrode;

conductive adhesive material within said cavity contacting said network ground electrode for establishing a ground plate within said inner body; and a discrete conductive member disposed between said conductive material and said shell for electrically coupling said conductive material to said shell.

10. A filter connector as defined in claim 9 wherein said cavity includes facing wall surfaces and wherein said connector further includes at least one conductive metal plate adjacent one of said wall surfaces and electrically coupled to both said conductive material and said shell.

11. A filter connector as defined in claim 19 wherein said conductive filler material comprises conductive epoxy.

12. A filter connector as defined in claim 11 wherein said conductive epoxy comprises silver loaded epoxy.

13. A filter connector comprising:

an electrically conductive outer shell;

an inner body within said shell including at least one longitudinally extending channel and a transverse cavity communicating with said channel and said shell;

network filter means within at least a portion of said channel and extending through said cavity, said network including an external ground electrode and a pin electrode;

a contact member cooperating with said filter means, said contact member being electrically coupled to said pin electrode;

conductive adhesive material within said cavity and contacting said network ground electrode for establishing a ground plate within said inner body;

a discrete conductive member disposed between said conductive material and said shell for electrically coupling said conductive material to said shell; and at least one electrically conductive metal element disposed at least partially within said cavity, said metal element contacting said conductive material and said discrete conductive member.

14. A filter connector comprising:

an electrically conductive outer shell;

an inner body within said shell including at least one longitudinally extending channel and a transverse cavity communicating with said channel and said shell;

network filter means within at least a portion of said channel and extending through said cavity, said network including an external ground electrode within said cavity and a pin electrode;

a contact member cooperating with said filter means, said contact member being electrically coupled to said pin electrode;

conductive adhesive material within said cavity, said conductive material being electrically coupled to said shell and said network ground electrode for establishing a ground plate within said inner body; and said shell further including means enabling injection of said conductive material into said cavity.

15. A filter connector as defined in claim 14 wherein said means enabling injection of said conductive material into said cavity includes aperture means in said shell.

16. A filter connector as defined in claim 15 wherein said aperture means comprise at least one aperture extending from said cavity to the exterior of said shell.

17. A filter connector as defined in claim 15 wherein said aperture means comprise a plurality of apertures extending from said cavity to the exterior of said shell.

18. A filter connector comprising:

an electrically conductive outer shell;

an inner body within said shell including at least one longitudinally extending channel and a transverse cavity communicating with said channel and said shell;

network filter means within at least a portion of said channel and extending through said cavity, said network means including an external ground electrode within said cavity and a pin electrode;

a contact member cooperating with said filter means, said contact member being electrically coupled to said pin electrode;

a thin metallic ground plate within said cavity and contacting said ground electrode, said thin metallic ground plate providing an intermediate filter connector ground plate to facilitate the testing of predetermined filter parameters of said network filter means at low RF current levels; and conductive adhesive material within said cavity, said conductive filler material being electrically coupled to said shell and contacting said network ground electrode for establishing a final ground plate within said inner body for enabling high RF current conduction by said connector.

19. A filter connector as defined in claim 18 wherein said cavity includes facing wall surfaces and wherein said intermediate ground plate is closely adjacent one of said wall surfaces.

20. A filter connector as defined in claim 18 wherein said intermediate ground plate includes at least one aperture arranged and dimensions for receiving said network filter means and including inwardly extending wiper tines for making wiping contact with said network filter ground electrode.

21. A method of establishing a ground plate within a filter connector of the type which includes an outer conductive shell having an inner surface, an inner body and a filter network contact assembly within the body having a ground electrode, said method comprising the steps of:

providing a cavity within the shell around the ground electrode; and thereafter flowing conductive filler material into said cavity around and in contact with the ground electrode and into electrical contact with the shell.

22. A method as defined in claim 21 comprising the further step of plating at least a portion of the cavity inner surface with conductive material and flowing the conductive filler material additionally into contact with the cavity inner surface plating.

23. A method as defined in claim 21 wherein said conductive filler material is injected in said cavity for flowing said conductive material into said cavity.

24. A method as defined in claim 23 comprising the further step of providing a bore in the shell extending from said cavity to the outer periphery of the shell and thereafter injecting said conductive filler material through said bore into said cavity.

25. A method as defined in claim 21 wherein said conductive filler material is conductive epoxy.

26. A method as defined in claim 25 wherein said conductive epoxy comprises silver loaded epoxy.

27. A method of manufacturing a filter connector of the type which includes a electrically conductive outer shell and an inner body assembly including an inner body having at least one channel extending through the inner body, a ground plate, and a network filter contact assembly within the channel having a ground electrode and a pin electrode said method comprising the steps of:

providing a mold having an inner surface substantially corresponding in shape to the inner surface shape of the outer shell;

inserting into said mold a first pre-formed dielectric member having at least one bore and an outer surface dimension corresponding to the inner surface shape of said mold;

inserting into said first member bore the network filter contact assembly;

inserting into said mold a second pre-formed dielectric member having at least one bore and outer surface dimension corresponding to the inner surface shape of said mold and positioning said second member within said mold spaced apart from said first member forming a cavity therebetween and aligned with respect thereto so that said second member bore receives the network filter contact assembly and is aligned with said first member bore;

flowing curable conductive filler material into said cavity around and in contact with the network filter ground electrode;

allowing said curable conductive filler material to cure to form an integral inner body assembly with said conductive filler material providing the connector ground plate;

removing said integral inner body assembly from said mold; and thereafter inserting said integral inner body assembly into the outer conductive shell with said cured filler material electrically coupled to the shell.

28. A method as defined in claim 27 comprising the further steps of providing a thin metallic intermediate ground plate having at least one aperture, positioning said intermediate ground plate within said mold closely adjacent said first member with said aperture receiving the network filter contact assembly and contacting the network filter ground electrode prior to the insertion of said second member into said mold and testing predetermined filter parameters of the network filter assembly at low RF currents using said intermediate ground plate prior to flowing said conductive curable filler material into said cavity.

29. A method as defined in claim 27 comprising the further step of plating at least a portion of said cavity with conductive material and thereafter flowing said curable conductive filler material additionally into contact with the cavity inner surface plating.

30. A method as defined in claim 37 comprising the further steps of providing a recess within the outer conductive shell, inserting an electrically conductive spring member into said recess, and thereafter positioning said integral inner body assembly within the shell with said cured conductive filler material in contact with said electrically conductive spring member.

31. A method as defined in claim 27 comprising the further steps of providing at least two apertures through said mold from said cavity to the exterior of said mold and injecting said curable conductive filler material into said cavity through one said bore until injected curable conductive material flows from the other said bore.

* * * * *